United States Patent
Adachi et al.

(10) Patent No.: US 7,626,618 B2
(45) Date of Patent: Dec. 1, 2009

(54) SOLID-STATE IMAGE PICKUP DEVICE, DRIVING METHOD FOR SOLID-STATE IMAGE PICKUP DEVICE AND IMAGE PICKUP APPARATUS

(75) Inventors: Kouzo Adachi, Kanagawa (JP); Yoshiaki Inada, Tokyo (JP); Junichi Inutsuka, Nagasaki (JP); Ken Koseki, Kanagawa (JP)

(73) Assignee: Sony Corporation, Tokyo (JP)

( * ) Notice: Subject to any disclaimer, the term of this patent is extended or adjusted under 35 U.S.C. 154(b) by 430 days.

(21) Appl. No.: 11/537,725

(22) Filed: Oct. 2, 2006

(65) Prior Publication Data

US 2007/0080376 A1    Apr. 12, 2007

(30) Foreign Application Priority Data

Oct. 4, 2005    (JP)    ............ P2005-290783

(51) Int. Cl.
H04N 9/083    (2006.01)
H04N 9/64    (2006.01)
H03N 1/00    (2006.01)

(52) U.S. Cl. .................. 348/248; 348/299; 341/122
(58) Field of Classification Search ................ 348/243, 348/248, 297, 299; 341/118, 120, 122, 155
See application file for complete search history.

(56) References Cited

U.S. PATENT DOCUMENTS 6,498,576 B1 * 12/2002 Tian et al. .................... 341/155
6,937,279 B1 *  8/2005 Kim et al. .................... 348/308
7,218,260 B2 *  5/2007 Lim ........................... 341/122
7,372,492 B2 *  5/2008 Ahn ........................... 348/308

FOREIGN PATENT DOCUMENTS

| JP | 2000-287131 | 10/2000 |
| JP | 2001-024949 | 1/2001 |
| JP | 2004-248304 | 9/2004 |
| JP | 2004-320346 | 11/2004 |

* cited by examiner

Primary Examiner—Nhan T Tran
Assistant Examiner—Trung Diep
(74) Attorney, Agent, or Firm—Sonnenschein Nath & Rosenthal LLP

(57) ABSTRACT

A solid-state image pickup device includes a pixel array section including a plurality of unit pixels, a reference signal production section configured to generate a reference signal and output a detection value, a comparison section configured to compare a reset level upon resetting, a counter configured to start a counting action and continue the counting action to measure a comparison time period in order to obtain count values corresponding to the reset level and the signal level, a detection section configured to retain a result of the comparison of said comparison section when the reset level reaches the detection value as a result of the detection of a black sun phenomenon for a fixed period of time, and a prevention section configured to prevent a black sun phenomenon based on a result of the detection of said detection section.

8 Claims, 12 Drawing Sheets

SOLID-STATE IMAGE PICKUP DEVICE, DRIVING METHOD FOR SOLID-STATE IMAGE PICKUP DEVICE AND IMAGE PICKUP APPARATUS

CROSS REFERENCES TO RELATED APPLICATIONS

The present invention contains subject matter related to Japanese Patent Application JP 2005-290783 filed with the Japanese Patent Office on Oct. 4, 2005, the entire contents of which being incorporated herein by reference.

BACKGROUND OF THE INVENTION

1. Field of the Invention

This invention relates to a solid-state image pickup device, a driving method for a solid-state image pickup device and an image pickup apparatus.

2. Description of the Related Art

In recent years, solid-state image pickup devices such as a CCD (Charge Coupled Device) type image sensor and a CMOS (Complementary Metal Oxide Semiconductor) type image sensor are used widely as an image inputting device or image pickup device for an image pickup apparatus incorporated in various portable terminal equipments such as a portable telephone set or image pickup apparatus such as a digital still camera or a digital video camera.

FIG. 10 is a circuit diagram showing an example of a configuration of a unit pixel of a general solid-state image pickup device. Referring to FIG. 10, the unit pixel 100 shown has a circuit configuration wherein it includes four transistors in addition to a photoelectric conversion element such as, for example, a photodiode 101. The four transistors include, for example, a transfer transistor 102, a reset transistor 103, an amplification transistor 104 and a selection transistor 105. In the circuit configuration shown in FIG. 10, for example, an n-channel MOS transistor is used for the transistors 102 to 105.

The transfer transistor 102 is connected between the cathode electrode of the photodiode 101 and a floating diffusion (FD) portion 106 and has a gate electrode connected to a transfer control line 111 to which a transfer gate pulse TG is applied. The reset transistor 103 is connected at the drain electrode thereof to a power supply Vdd, at the source electrode thereof to the FD portion 106, and at the gate electrode thereof to a reset control line 112 to which a reset pulse RS is applied.

The amplification transistor 104 has a source follower circuit configuration with the gate electrode thereof connected to the FD portion 106 and with the source electrode thereof connected to a signal line 123. The signal line 123 is connected at one end thereof to a constant current source 124. The selection transistor 105 is connected at the drain electrode thereof to the power supply Vdd, at the source electrode thereof to the drain electrode of the amplification transistor 104, and at the gate electrode thereof to a selection control line 113 to which a selection pulse SEL is applied.

FIG. 11 is a sectional view showing a cross sectional structure of the unit pixel except the amplification transistor 104 and the selection transistor 105.

Referring to FIG. 11, n-type diffusion regions 132, 133 and 134 are formed on a surface layer portion of a p-type substrate 131. A gate electrode 135 is formed at a portion of the p-type substrate 131 between the n-type diffusion region 132 and the n-type diffusion region 133 with a gate oxide film (SiO$_2$) not shown interposed therebetween. Another gate electrode 136 is formed at another portion of the p-type substrate 131 between the n-type diffusion region 133 and the n-type diffusion region 134 with the gate oxide film interposed therebetween.

In a corresponding relationship to FIG. 10, the photodiode 101 is formed by a pn junction between the p-type substrate 131 and the n-type diffusion region 132. The transfer transistor 102 is formed from the n-type diffusion region 132, the n-type diffusion region 133 and the gate electrode 135 between the n-type diffusion region 132 and the n-type diffusion region 133. The reset transistor 103 is formed from the n-type diffusion region 133, the n-type diffusion region 134 and the gate electrode 136 between the n-type diffusion region 133 and the n-type diffusion region 134.

The n-type diffusion region 133 forms the FD portion 106 and is electrically connected to the gate electrode of the amplification transistor 104. The power supply Vdd is applied to the n-type diffusion region 134 which forms a drain region of the reset transistor 103. The upper face of the p-type substrate 131 is covered with a light intercepting layer 137 except the photodiode 101.

Now, circuit action of the unit pixel 100 is described with reference to the sectional view of FIG. 11 and a waveform diagram of FIG. 12.

If light is irradiated on the photodiode 101 as seen in FIG. 11, then pairs of an electron (−) and a hole (+) are induced in response to the intensity of the light, in other words, photoelectric conversion is performed. Further, a selection pulse SEL is applied to the gate electrode of the selection transistor 105 at time T1 in FIG. 12, and a reset pulse RS is applied to the gate electrode of the reset transistor 103 at the same time. As a result, the reset transistor 103 is placed into a conducting state, and the FD portion 106 is reset to the power supply Vdd at time T2.

When the FD portion 106 is reset, the potential of the FD portion 106 upon such resetting is outputted as a reset level Vn to the signal line 123 through the amplification transistor 104. This reset level Vn corresponds to a noise component unique to the unit pixel 100. The reset pulse RS keeps an active state of the "H" level within a predetermined period from time T1 to time T3. The FD portion 106 keeps its reset state also after the reset pulse RS changes over from the active state into an inactive state of the "L" level. The period within which the FD portion 106 remains in the reset state is a reset period.

Thereafter, while the selection pulse SEL remains in the active state, a transfer gate pulse TG is applied to the gate electrode of the transfer transistor 102 at time T4. Consequently, the transfer transistor 102 is placed into a conducting state, and signal charge produced by photoelectric conversion by the photodiode 101 and accumulated till then is transferred to the FD portion 106. As a result, the potential of the FD portion 106 varies in response to the amount of the signal charge in a period from time T4 to time T5. The potential of the FD portion 106 at this time is outputted as a signal level Vs to the signal line 123 through the amplification transistor 104 (signal readout period). Then, a difference RSI1 between the signal level Vs and the reset level Vn presents a pure pixel signal level free from any noise component.

Usually, when an image of a bright object is picked up, the amount of charge accumulated in the photodiode 101 within the reset period becomes greater than that when an image of a dark object is picked up, and therefore, the difference RSI1 on the signal line 123 is greater.

(Mechanism in Occurrence of a Black Sun Phenomenon)

Incidentally, it is known that a black sun phenomenon occurs with a solid-state image pickup device. The black sun phenomenon is a phenomenon that, when very intense light such as the sunlight enters the pixel 100, the brightest portion is depressed dark.

A mechanism in occurrence of a black sun phenomenon is described with reference to FIGS. 13 and 14. FIG. 13 is a schematic view illustrating a mechanism in occurrence of a black sun phenomenon and shows a structure substantially similar to that shown in FIG. 11. FIG. 14 is a waveform diagram of the unit pixel shown in FIG. 13 when a black sun phenomenon occurs.

Within a reset period, a selection pulse SEL is applied to the gate electrode of the selection transistor 105 at time T1' and a reset pulse RS is applied to the gate electrode of the reset transistor 103 at the same time in a similar manner as in the unit pixel shown in FIG. 11. As a result, the reset transistor 103 is placed into a conducting state, and the FD portion 106 is reset to the power supply Vdd at time T2'. The potential of the FD portion 106 upon such resetting is outputted as a reset level Vn to the signal line 123 through the amplification transistor 104.

However, if very intense light such as the sunlight is irradiated upon the photodiode 101 as seen in FIG. 13, then a large number of pairs of an electron (−) and a hole (+) when compared with those in the unit pixel of FIG. 11 are induced in a pn junction portion formed by the p-type substrate 131 and the n-type diffusion region 132. As a result, surplus electrons produced by the photoelectric conversion overflow from the photodiode 101. As a result, although the transfer gate pulse TG is in an inactive state, the surplus electrons arrive at the FD portion 106 across the transfer transistor 102. Therefore, the potential of the FD portion 106 drops, and as a result, the potential of the signal line 123 drops in a period from time T2' to time T4'.

Similarly, if a transfer gate pulse TG is applied to the gate electrode of the transfer transistor 102 at time T4' while the selection pulse SEL remains in an active state within a signal readout period, then the transfer transistor 102 is placed into a conducting state. Consequently, signal charge produced by photoelectric conversion by the photodiode 101 and accumulated is transferred to the FD portion 106. As a result, the potential of the FD portion 106 varies in response to the amount of the signal charge in a period from time T4' to time T5'. The potential of the FD portion 106 at this time is outputted as a signal level Vs to the signal line 123 through the amplification transistor 104.

At this time, as a result of the overflowing of surplus electrons within the reset period as described above, the potential of the signal line 123 exhibits a drop when compared with that upon application of the reset pulse RS as seen apparently from FIG. 14. As a result, the potential difference RS12 within the signal readout period drops although the intense light is irradiated.

FIG. 15 is a diagrammatic view illustrating a mechanism in occurrence of a black sun phenomenon. Referring to FIG. 15, the axis of abscissa indicates the incident light amount to the pixel 100 and the axis of ordinate indicates the pixel signal amount obtained from the pixel 100.

In a usual state, the difference Vsig-Vres between the signal level Vsig within a signal readout period and the reset level Vres within a reset period is outputted as a pixel signal level. If the incident light amount exceeds a fixed light amount B, then the signal level Vsig is saturated and a fixed pixel signal level is outputted.

Then, the light leak noise Vn becomes a gradually increasing signal at a predetermined light amount C which is greater than the light amount B. Then, if a differencing process is performed within a region within which the light amount C is exceeded, then the difference Vsig-Vres exhibits a reduced value although the intense light is irradiated. Therefore, although the image pickup object is very bright, a black sun phenomenon wherein it looks dark occurs.

Here, the light leak noise Vn is described. When intense excessively high light comes in, charge accumulated in the photodiode 101 which has a function of converting light into electrons may overflow, and the overflowing charge makes noise. Or, when light leaks into the FD portion 106 which has a function of converting charge read out from the photodiode 101 into an electric signal, the leaking-in component makes noise.

In order to prevent a black sun phenomenon, in the past, it is decided whether or not the incident light is very intense by detecting whether the signal level Vsig is within a saturation region wherein the light amount B is exceeded and whether the reset level Vres is within a region within which it varies, that is, within a region wherein the light amount C is exceeded. Then, the differencing process Vsig-Vres is corrected based on a result of the decision. This method is disclosed, for example, in Japanese Patent Laid-Open No. 2004-248304.

In particular, such a countermeasure as shown in FIG. 16 is taken. Referring to FIG. 16, a switch 206 is interposed in a signal line for a reset level Vres between an amplifier 204 and a differential amplifier 205. The amplifier 204 amplifies a reset level Vres and a signal level Vsig outputted from a pixel array section 201 through an N memory 202 and an S memory 203, respectively. The differential amplifier 205 differentially amplifies the signal level Vsig and the reset level Vres from the N memory 202 and the S memory 203, respectively. Then, if a light level detection circuit 207 detects that the signal level Vsig is equal to or higher than a predetermined level Va or the reset level Vres is equal to a predetermined level Vb, then the switch 206 is switched off to stop the differential amplification process of the differential amplifier 205 to prevent a black sun phenomenon.

Or, such another countermeasure as shown in FIG. 17 is taken. Referring to FIG. 17, also when the light level detection circuit 207 detects that the signal level Vsig is equal to or higher than the predetermined level Va or the reset level Vres is equal to the predetermined level Vb, the differential amplifier 205 performs a differential amplification action. Then, a resulting difference by the differential amplifier 205 is converted into a digital signal by an A/D conversion circuit 208 and stored into a memory 209. On the other hand, upon detection of the state described hereinabove by the light level detection circuit 207, when the difference signal is read out from the memory 209, the difference signal is converted into a signal of a predetermined level, that is, the level Va, by a conversion circuit 210 or digital data of the A/D conversion circuit 208 are converted into saturation data in response to a saturation detection signal of the light level detection circuit 207 to prevent a black sun phenomenon.

SUMMARY OF THE INVENTION

However, both of the related art apparatus described hereinabove have a problem that, since it is necessary to additionally provide the light level detection circuit 207, which detects whether the signal level Vsig is equal to or higher than the predetermined level Va or whether the reset level Vres is equal to the predetermined level Vb, to an existing system, the circuit for preventing a black sun phenomenon is obliged to have an increased circuit scale. Further, where the latter apparatus is employed, an additional bit has to be provided as a flag for detection of a black sun phenomenon to the output signal of the light level detection circuit 207.

Therefore, it is desirable to provide a solid-state image pickup device and a driving method for a solid-state image pickup device wherein the circuit scale of a circuit for detecting a black sun phenomenon can be suppressed to a low level.

According to an embodiment of the present invention, there is provided a solid-state image pickup device including a pixel array section having a plurality of unit pixels disposed therein and each having a photoelectric conversion element which converts incident light from the outside into an electric signal, a reference signal production section configured to generate a reference signal of a ramp waveform, a comparison section configured to compare a reset level upon resetting included in an analog signal outputted from the unit pixels and a signal level corresponding to the incident light with the reference voltage, a counter configured to start a counting action in synchronism with supply of the reference signal to the comparison section and continue the counting action until a comparison output of the comparison section indicates a reversal to measure a comparison time period until the comparison by the comparison section comes to an end thereby to obtain count values corresponding to the reset level and the signal level, a detection section configured to retain a result of the comparison of the comparison section when the reset level reaches the detection value as a result of the detection of a black sun phenomenon for a fixed period of time, and a prevention section configured to prevent a black sun phenomenon based on a result of the detection of the detection section.

In the solid-state image pickup device, the comparison section compares, within the period within which a black sun phenomenon is to be detected, the reset level with the detection value. Consequently, the comparison section forms part of an apparatus for detecting a black sun phenomenon. Accordingly, the apparatus for detecting a black sun phenomenon can be implemented basically with a simple configuration wherein a circuit for retaining a result of the comparison within the period within which a black sun phenomenon is to be detected is additionally provided.

Therefore, with the solid-state image pickup device, since the apparatus for detecting a black sun phenomenon can be implemented with a simple circuit configuration, the circuit scale can be suppressed to a low level and the layout area can be suppressed to the minimum.

The above and other needs, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

Figure 1:
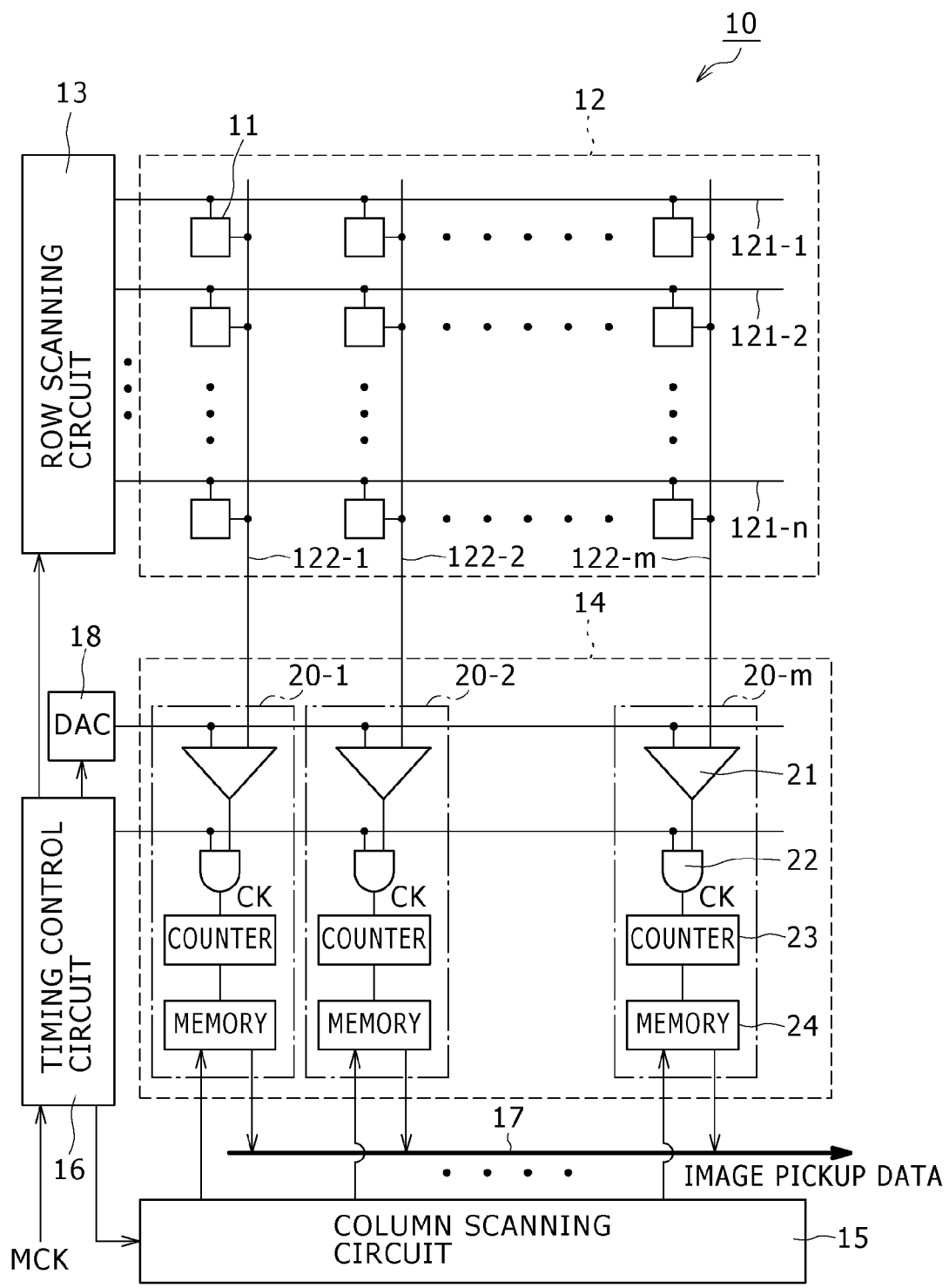
FIG. 1 is a block diagram showing a basic configuration of a solid-state image pickup device which incorporates column-parallel ADCs and to which the present embodiment is applied.

FIG. 1 shows a basic configuration of a solid-state image pickup device to which the present embodiment is applied. The solid-state image pickup device may be, for example, a CMOS image sensor and incorporates a column-parallel ADC array wherein an analog-digital converter (hereinafter referred to simply as ADC) is disposed for each of columns of a pixel array in the form of, for example, a matrix.

Figure 10:
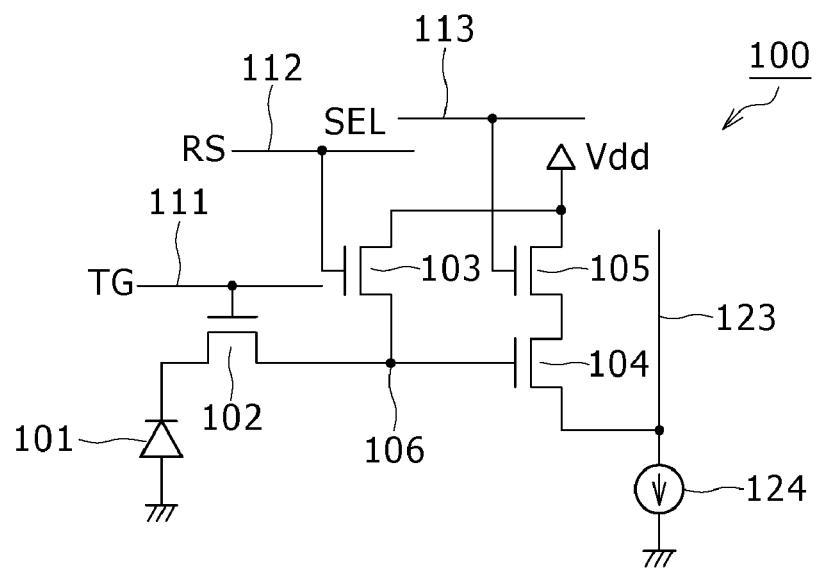
FIG. 10 is a circuit diagram showing an example of a configuration of a unit pixel of a general solid-state image pickup device.
Figure 11:
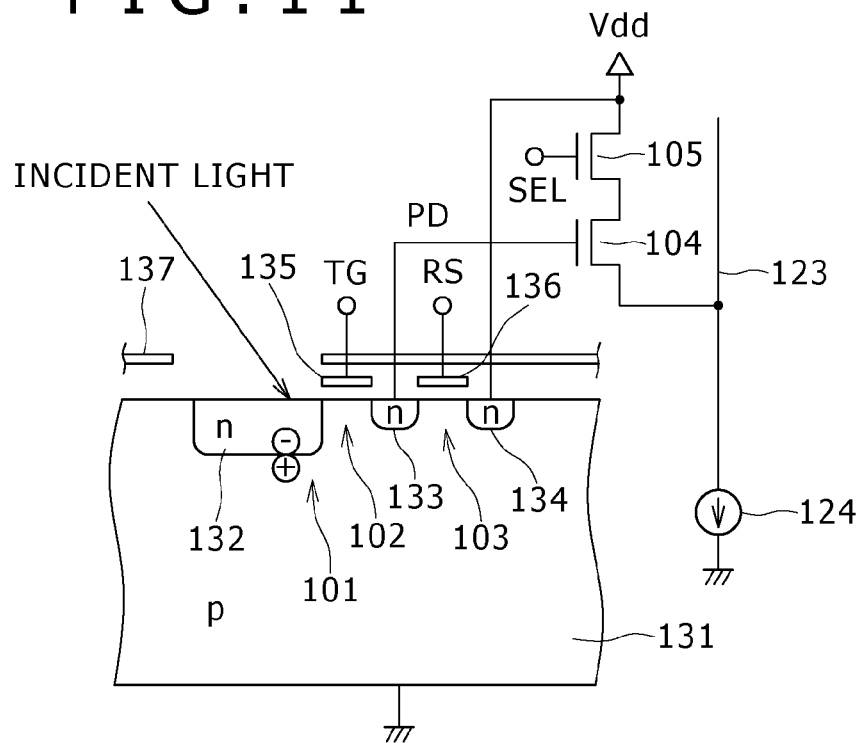
FIG. 11 is a sectional view showing a sectional structure of part of the unit pixel of FIG. 10.

Referring to FIG. 1, a unit pixel 11 includes a photoelectric conversion element such as, for example, a photodiode and a pixel transistor (in-pixel amplifier). A plurality of such unit pixels 11 are disposed two-dimensionally in a matrix of n rows and m columns to form a pixel array section 12. For the unit pixels 11, for example, the unit pixel of the four-transistor configuration described hereinabove with reference to FIG. 10 may be used.

However, a unit pixel to be used for the unit pixels 11 is not limited to that of the four-transistor configuration, but any unit pixel may be used if it includes a photoelectric conversion element and an output transistor which outputs a signal corresponding to charge obtained by photoelectric conversion by the photoelectric conversion element such as, for example, a unit pixel of a 3-transistor configuration wherein the amplification transistor is used also as a selection transistor.

For the pixel array of n rows and m columns of the pixel array section 12, row control lines 121 (121-1 to 121-n) are laid for the individual rows and column signal lines 122 (122-1 to 122-m) are laid for the individual columns. Peripheral driving circuits for the pixel array section 12 are provided around the pixel array section 12. The peripheral driving circuits include a row scanning circuit 13, a column processing section or column-parallel ADC block 14, a column scanning circuit 15 and a timing control circuit 16.

The row scanning circuit 13 controls row addresses and row scanning of the pixel array section 12 through the row control lines 121-1 to 121-n. The column processing section 14 is formed from ADCs 20-1 to 20-m disposed for the individual column signal lines 122-1 to 122-m on one end side of the column signal lines 122-1 to 122-m.

An apparatus for supplying a reference voltage VREF, for example, a digital-analog converter hereinafter referred to simply as DAC 18, is provided for each of the ADCs 20-1 to 20-m. The DAC 18 produces, as the reference voltage VREF, a signal of a ramp waveform which indicates a stepwise variation which varies, for example, downwardly as time passes in response to a clock signal supplied from the timing control circuit 16.

Each of the ADCs 20 (20-1 to 20-m) includes a comparator 21, an AND circuit 22, a counter 23 and a memory element 24 and has a function of converting a analog signal VSL provided from a corresponding unit pixel 11 through a corresponding one of the column signal lines 122-1 to 122-m into a digital signal.

For each of the row control lines 121-1 to 121-n, each comparator 21 compares the analog signal VSL of the unit pixel 11 of the selected row with the reference voltage VREF provided from the DAC 18. Then, if the analog signal VSL is lower than the reference voltage VREF, a comparison output Vcomp exhibits the high level (hereinafter referred to as "H" level). However, if the analog signal VSL is equal to or higher than the reference voltage VREF, then the comparison output Vcomp exhibits the low level (hereinafter referred to as "L" level).

The AND circuit 22 receives, at one of inputs thereof, a clock signal CLK which is provided from the timing control circuit 16 upon generation of the reference voltage VREF. The AND circuit 22 further receives, at the other input thereof, a comparison output Vcomp of the comparator 21 and masks the clock signal CLK with the comparison output Vcomp of the comparator 21. Consequently, when the comparison output Vcomp has the "H" level, the clock signal CLK passes through the AND circuit 22 and is provided as a clock signal CK to the counter 23.

The counter 23 typically is an up/down counter and performs a counting action in synchronism with the clock signal CK to measure a comparison time period on the comparator 21. In particular, the counter 23 measures a period of time after the reference voltage VREF is provided from the comparator 21 until the comparison output Vcomp is reversed from the "H" level to the "L" level. The memory element 24 retains a result of the counting of the counter 23 as a digital signal of N bits which is a result of the AD conversion.

The column scanning circuit 15 performs control of the column address and column scanning for each of the ADCs 20 (20-1 to 20-m) of the column processing section 14. In particular, N-bit digital signals each obtained by the AD conversion from one of the ADCs 20 and retained in the memory element 24 in the ADC 20 are successively read out into horizontal output lines 17 of the N-bit width by column scanning by the column scanning circuit 15 and outputted to the outside by the horizontal output lines 17.

The timing control circuit 16 produces clock signals and timing signals necessary for action of the row scanning circuit 13, column scanning circuit 15, DAC 18, counters 23 and so forth based on a master clock MCK and supplies the produced clock signals and timing signals to the corresponding circuit components.

In the solid-state image pickup apparatus 10 incorporating parallel-column ADCs having the configuration described above, peripheral circuits which drive and control the unit pixels 11 of the pixel array section 12 such as the row scanning circuit 13, column processing section 14, column scanning circuit 15, timing control circuit 16, DAC 18 and so forth are integrated on the same semiconductor substrate or chip as the pixel array section 12.

Figure 2:
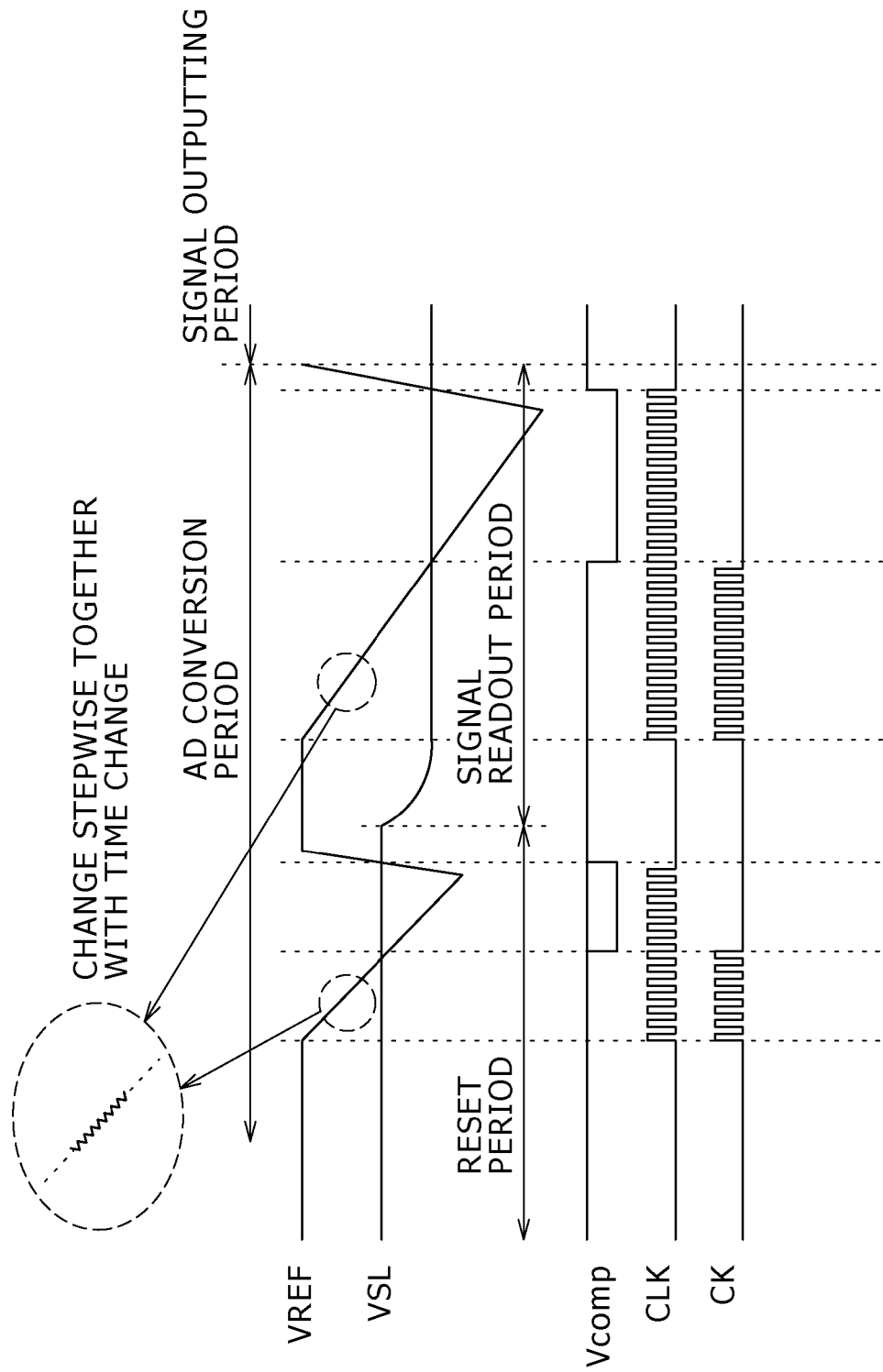
FIG. 2 is a timing chart illustrating action of the solid-state image pickup device upon normal image pickup.

Now, action of the solid-state image pickup apparatus 10 incorporating column-parallel ADCs having the configuration described above upon normal image pickup is described with reference to a timing chart of FIG. 2. FIG. 2 illustrates waveforms of the reference voltage VREF, analog signal (signal voltage of the column signal lines 122-1 to 122-m) VSL outputted from a unit pixel 11, comparison output Vcomp of the comparator 21 and clock signals CLK and CK and a timing relationship among them.

When the reference voltage VREF is supplied from the DAC 18 to the comparator 21 after a first time reading action for the column signal lines 122-1 to 122-m from a unit pixel 11 of a certain selected row becomes stable, a comparison action between the analog signal VSL of the column signal lines 122-1 to 122-m and the reference voltage VREF is performed by the comparator 21. Further, simultaneously when the reference voltage VREF is provided to the comparator 21, the clock signal CLK, that is, the clock signal CK, passes through the AND circuit 22 so that the counter 23 starts a first time counting action in synchronism with the clock signal CK.

Figure 3:
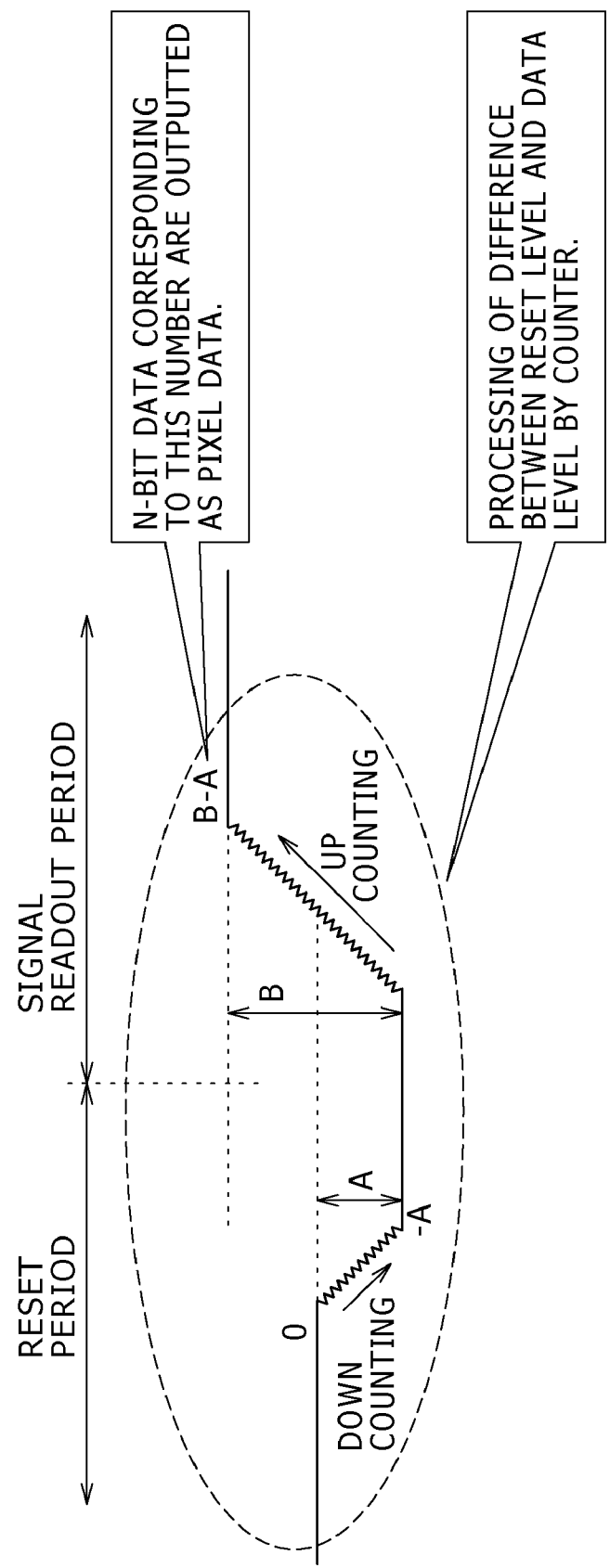
FIG. 3 is a diagrammatic view illustrating a concept of a counting action upon down counting and up counting.

In the first time counting action, the counter 23 performs down counting $(0, -1, -2, \ldots, -A)$ in synchronism with the clock signal CK as seen in FIG. 3. In the comparison action of the comparator 21, when the reference voltage VREF and the analog signal VSL become equal to each other, the polarity of the comparison output Vcomp of the comparator 21 is reversed from the "H" level to the "L" level. In response to the reversal in polarity of the comparison output Vcomp of the comparator 21, the clock signal CLK is masked by the AND circuit 22.

As a result of the masking of the clock signal CLK, the supply of the clock signal CK to the counter 23 is stopped, and consequently, the counting action of the counter 23 is stopped. In the first time reading out action described above, reading out of the reset level Vres for the unit pixels 11 is performed. Then, the count value corresponding to the comparison time period by the comparator 21 within the reset period is retained as a count value corresponding to the reset level Vres in the counter 23.

In the second time readout, readout of the signal level Vsig corresponding to the incident light amount for each unit pixel 11 is performed by a similar action to that in the first time readout. In particular, when the reference voltage VREF is supplied from the DAC 18 to the comparator 21 after the second time readout action from the unit pixels 11 of a certain selected row to the column signal lines 122-1 to 122-m becomes stable, a comparison action between the signal voltages VSL of the column signal lines 122-1 to 122-m and the reference voltage VREF is performed by the comparator 21. Further, simultaneously when the reference voltage VREF is provided to the comparator 21, a second time counting action is performed in synchronism with the clock signal CK by the counter 23.

In the second time counting action, the counter 23 performs up counting $(0, +1, +2, \ldots, +B)$ in synchronism with the clock signal CK as seen in FIG. 3. In the comparison action of the comparator 21, when the reference voltage VREF and the analog signal VSL become equal to each other, the polarity of the comparison output Vcomp of the comparator 21 is reversed from the "H" level to the "L" level. In response to the reversal in polarity of the comparison output Vcomp of the comparator 21, the clock signal CLK is masked by the AND circuit 22. Since the supply of the clock signal CK to the counter 23 is stopped as a result of the masking of the clock signal CLK, the counter 23 stops its counting action.

In the second time readout action, readout of the signal level Vsig of each of the unit pixels 11 is performed. It is to be noted, however, that, since second time counting, that is, up counting, is performed with reference to the count value of the first counting, that is, with reference to the count value of down counting, the final count value of the counter 23 is given as a value obtained by subtracting the second time count value from the first time count value (refer to FIG. 3). Then, the final count value is retained as a value representative of the signal level Vsig of the unit pixel 11, in the memory element 24.

After completion of the series of AD conversion actions described hereinabove, the N-bit digital signals retained in the memory 24 is outputted to the outside through the N horizontal output lines 17. Thereafter, a series of AD conversion actions similar to those described hereinabove is repeated for each row thereby to produce a two-dimensional image.

(Black Level Depression Detection Circuit)

In the solid-state image pickup apparatus 10 incorporating column-parallel ADCs described above, an apparatus for detecting a black sun phenomenon, that is, a black level depression detection circuit, is formed making use of the comparator 21 in the ADC 20.

FIRST CIRCUIT EXAMPLE

Figure 4:
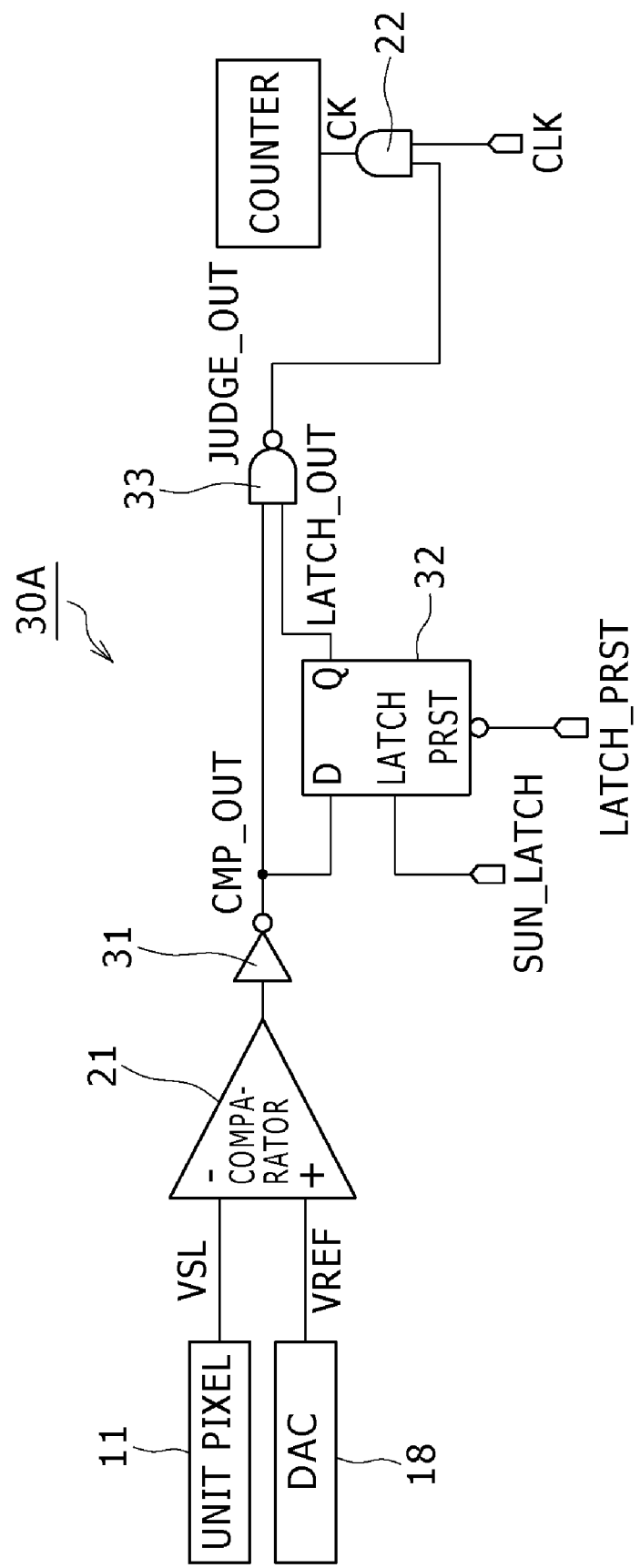
FIG. 4 is a circuit diagram showing a configuration of a black level depression detection circuit according to a first circuit example.

FIG. 4 is a circuit diagram showing a configuration of the black level depression detection circuit 30A according to the first circuit example. In particular, FIG. 4 shows the black level depression detection circuit 30A together with a unit pixel 11 in a certain pixel column.

Figure 12:
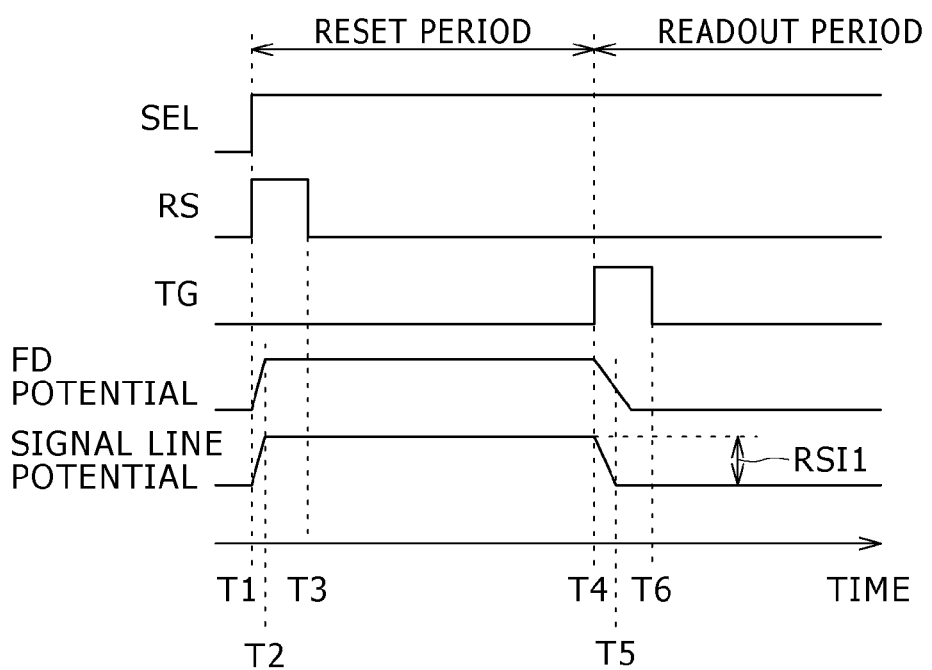
FIG. 12 is a waveform diagram illustrating circuit action of the unit pixel of FIG. 10.
Figure 13:
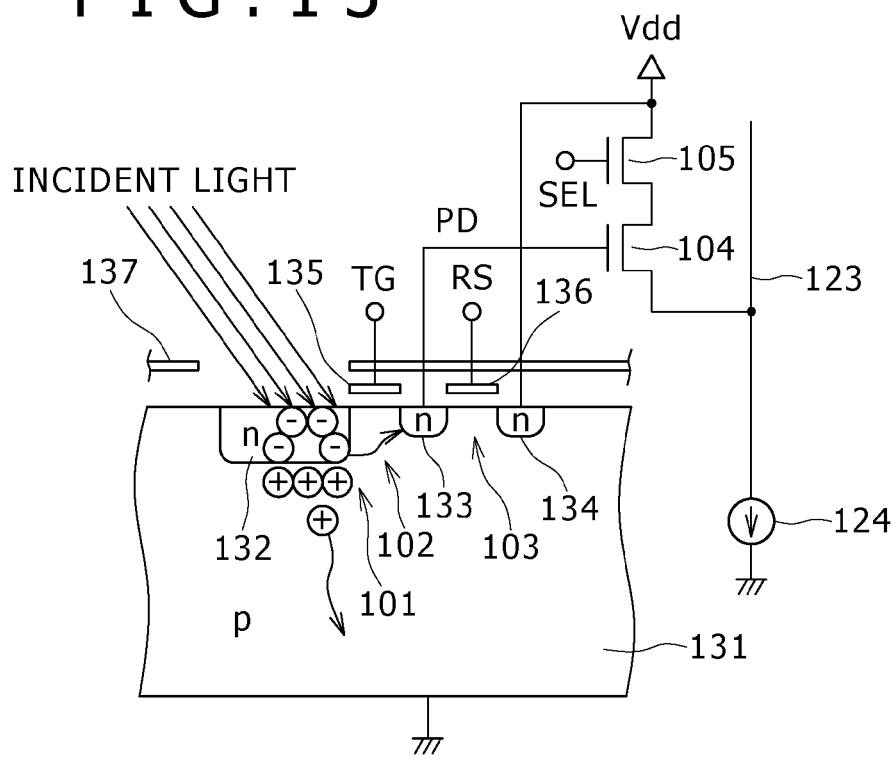
FIG. 13 is a schematic diagrammatic view illustrating a mechanism in occurrence of a black sun phenomenon in the unit pixel of FIG. 10.
Figure 14:
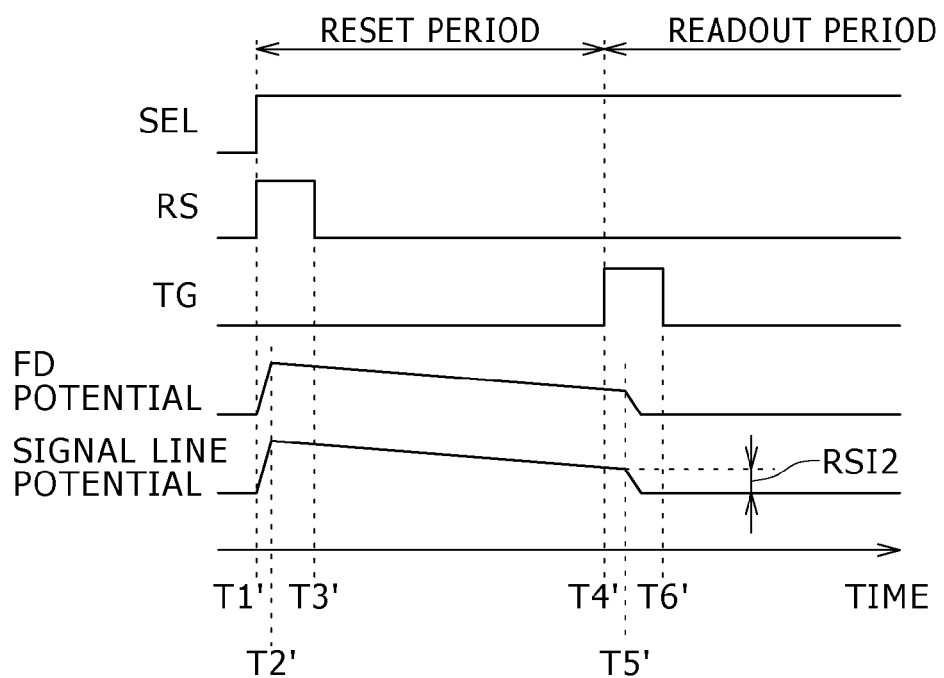
FIG. 14 is a waveform diagram of the unit pixel of FIG. 10 when a black sun phenomenon occurs.
Figure 15:
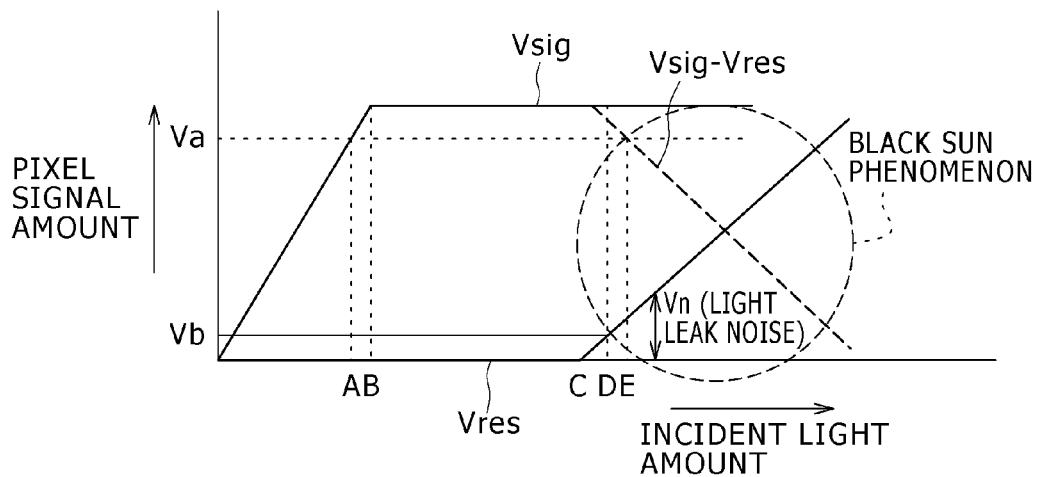
FIG. 15 is a diagram illustrating a mechanism in occurrence of a black sun phenomenon in the unit pixel of FIG. 10.
Figure 16:
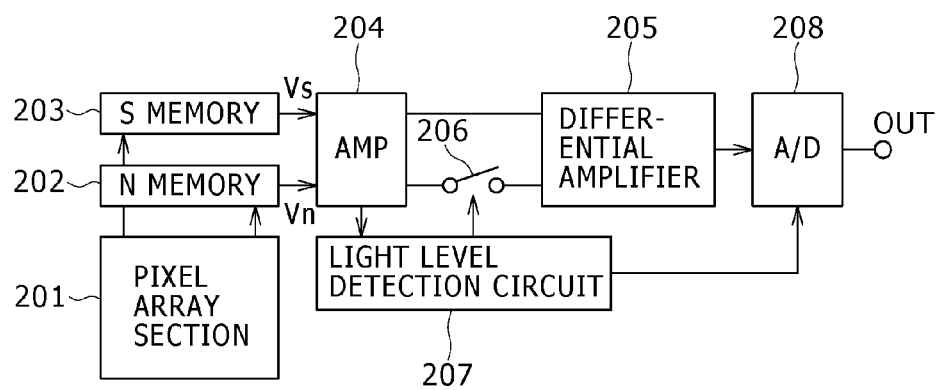
FIG. 16 is a block diagram showing a circuit of a related art for preventing a black sun phenomenon.
Figure 17:
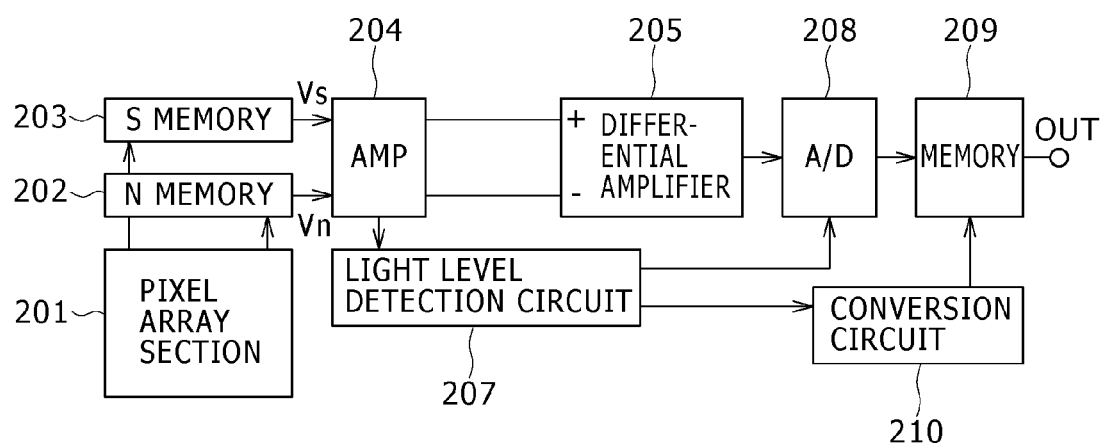
FIG. 17 is a block diagram showing another circuit of a related art for preventing a black sun phenomenon.

Referring to FIG. 4, the black level depression detection circuit 30A according to the first circuit example utilizes the DAC 18 and the comparator 21 and AND circuit 22 of the column processing section 14 and additionally includes an inverter 31, a latch circuit 32 and a NAND circuit 33. The black level depression detection circuit 30A is configured to perform black level depression detection within a black level depression period which is a fixed period from a timing at which the reset pulse RS (refer to FIG. 12) which exhibits an active state upon a resetting action of the unit pixel 11 is placed into an inactive state of the "L" level.

Within the black level depression detection period, the DAC 18 outputs a black level depression detection value of a fixed value which is lower by a fixed width or detection width ΔV than a maximum value of the reference voltage VREF. The black level depression detection value is set lower than the signal voltage VSL in the form of an analog signal voltage when normal light enters the unit pixel 11 but higher than the signal voltage VSL when excessively high light which may cause a black sun phenomenon enters the unit pixel 11. In other words, the black level depression detection value is used as an index which indicates a degree by which the reset level for the analog signal VSL drops from that in a normal state as a result of an influence of excessively high light before it is decided that a black sun phenomenon occurs.

The DAC 18 produces, when suitable digital data is inputted thereto, a black level depression detection value for black level depression detection as the reference voltage VREF in addition to a stepwise ramp waveform for reset level decision and another ramp waveform for signal level decision. In other words, the detection width ΔV for the determination of the black level depression detection value can be changed arbitrarily with the digital data to be inputted to the DAC 18.

The comparator 21 performs a decision of the reset level Vres and the signal level Vsig based on the reference voltage VREF of a ramp waveform. In addition, when the analog signal VSL becomes lower than the black level depression detection value within a black level depression detection period, the comparator 21 detects occurrence of a black sun phenomenon caused by excessively high light. A comparison output of the comparator 21 is reversed in polarity by the inverter 31 and is provided as a comparison output CMP_OUT to the D (data) terminal of the latch circuit 32 and also to one of the inputs of the NAND circuit 33.

The latch circuit 32 is initialized at a latch output LATCH_OUT thereof by a preset signal LATCH_PRST which is rendered active in synchronism with the reset pulse RS. When a latch signal SUN_LATCH has the "H" level, the latch circuit 32 stores the comparison output CMP_OUT of the comparator 21, that is, a black level depression detection result. The latch circuit 32 retains the latched black level depression detection result for a fixed period of time, that is, for a period of time until, for example, the preset signal LATCH_PRST is received next, in other words, for the period of 1 H (H is a horizontal period).

Figure 6:
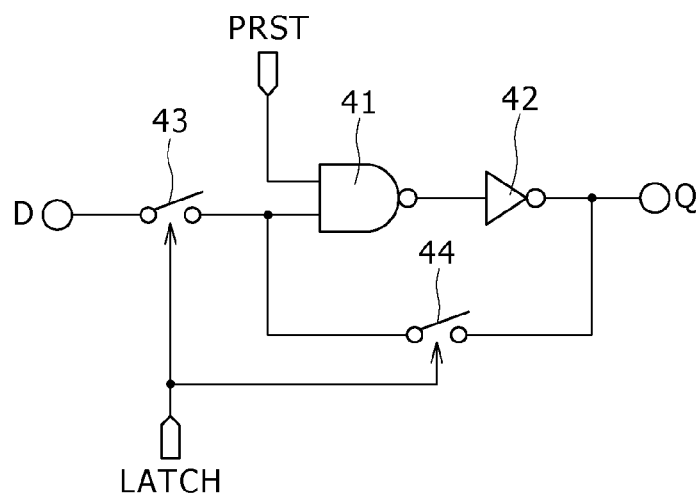
FIG. 6 is a circuit diagram showing an example of a configuration of a latch circuit shown in FIG. 4.

FIG. 6 is a circuit diagram showing an example of a configuration of the latch circuit 32. Referring to FIG. 6, the latch circuit 32 shown has a simple digital circuit configuration including a single NAND circuit 41, a single inverter 42 and a pair of switch elements 43 and 44. Referring back to FIG. 4, the latch output LATCH_OUT of the latch circuit 32 is provided as the other input to the NAND circuit 33.

The NAND circuit 33 arithmetically operates a logical NAND of the comparison output CMP_OUT of the comparator 21 and the latch output LATCH_OUT. A counting permission signal JUDGE_OUT which is a result of the arithmetic operation of the NAND circuit 33 is supplied to the other input of the AND circuit 22 in place of the comparison output Vcomp of the comparator 21 to prevent a black sun phenomenon. In other words, the NAND circuit 33 acts as a prevention section.

Figure 5:
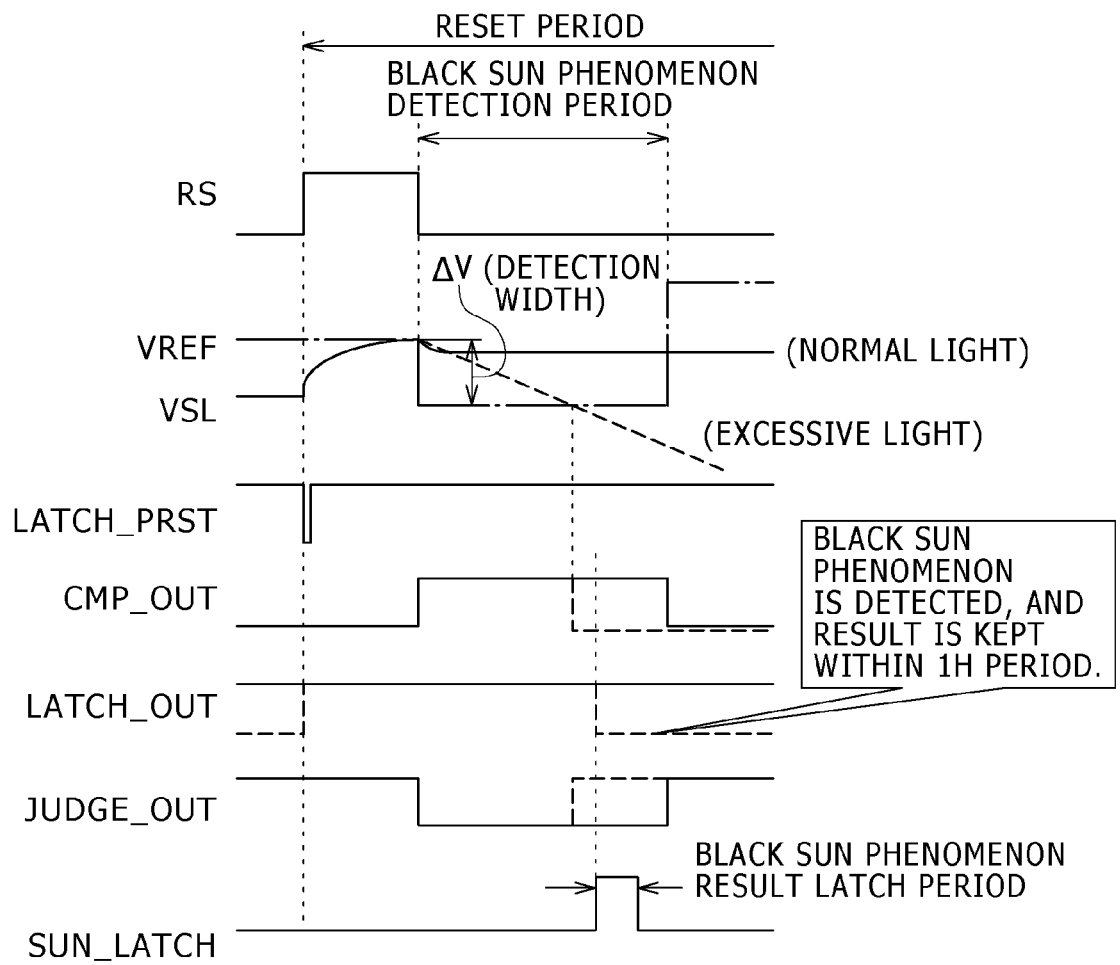
FIG. 5 is a timing chart illustrating circuit action of the black level depression detection circuit of FIG. 4.

Now, circuit action of the black level depression detection circuit 30A having the configuration described above is described with reference to a timing chart of FIG. 5. FIG. 5 illustrates a timing relationship among the reset pulse RS, reference voltage VREF, signal voltage VSL, preset signal LATCH_PRST, comparison output CMP_OUT, latch output LATCH_OUT, counting permission signal JUDGE_OUT and latch signal SUN_LATCH.

(1) Where black level depression caused by excessively high light is detected

If the reference voltage VREF for the signal voltage VSL drops to the black level depression detection value as a result of incidence of excessively high light, that is, if the dropping amount reaches the detection value ΔV, then the comparison output CMP_OUT of the comparator 21 changes over from the "H" level to the "L" level. The comparison output CMP_OUT of the "L" level is stored into the latch circuit 32 when the latch signal SUN_LATCH changes over to the "H" level.

Then, if the latch signal SUN_LATCH changes over from the "H" level to the "L" level, then the latch output LATCH_OUT of the latch circuit 32 is retained at the "L" level". At this time, a logical NAND of the latch output LATCH_OUT and the comparison output CMP_OUT is arithmetically operated by the NAND circuit 33. Consequently, the counting permission signal JUDGE_OUT which is an output of the NAND circuit 33 changes over from the "L" level to the "H" level.

Since the "L" level state of the latch output LATCH_OUT is kept for a 1 H period, also the "H" level state of the counting permission signal JUDGE_OUT is kept for a 1 H period. Consequently, the AND circuit 22 continues to output the clock signal CLK as the clock signal CK for the 1 H period, and therefore, the counter 23 does not stop but continues to perform a counting operation to a full count value, which is a maximum count value which the counter 23 can take, in synchronism with the clock signal CK.

Then, the full count value of the counter 23 is retained by the memory element 24 of FIG. 1 and outputted to the outside through the horizontal output lines 17 by column scanning by the column scanning circuit 15. Here, the count value of the counter 23 corresponds to the white signal level. Accordingly, even if excessively high light, particularly very intense light such as sunlight, enters the unit pixel 11, since the signal level based on the full count value of the counter 23 is the white signal level, a black sun phenomenon wherein the brightest portion becomes dark can be prevented.

After the black level depression detection period comes to an end, actions for a normal difference determination process, that is, actions within a reset period and a signal readout period described hereinabove are successively performed. Consequently, a digital signal of a signal level corresponding to the intensity of the incident light to the unit pixel 11 is outputted to the outside.

(2) Normal case wherein no black level depression occurs

If normal light which is within a permissible range enters a unit pixel 11, since the reference voltage VREF of the signal voltage VSL does not drop at all, the comparison output CMP_OUT of the comparator 21 is not reversed but keeps the "H" level.

At this time, since the latch output LATCH_OUT keeps the "H" level, the counting permission signal JUDGE_OUT relies upon the comparison output CMP_OUT of the comparator 21. In particular, a result of the reversal of the comparison output CMP_OUT, that is, the "L" level, is provided as the counting permission signal JUDGE_OUT to the AND circuit 22. After the black level depression detection period comes to an end, a normal difference determination process is performed.

SECOND CIRCUIT EXAMPLE

Figure 7:
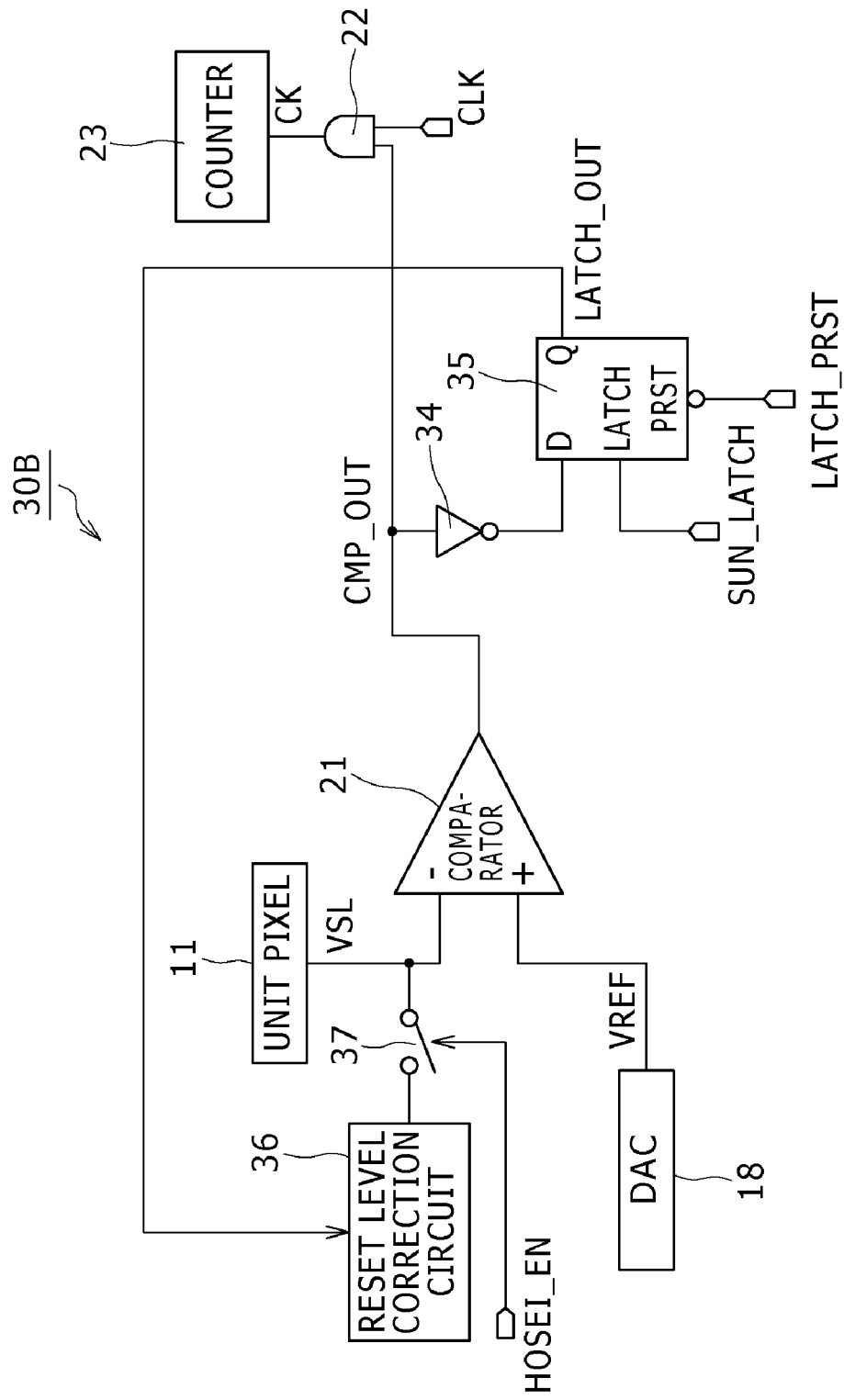
FIG. 7 is a circuit diagram showing a configuration of a black level depression detection circuit according to a second circuit example.

FIG. 7 is a circuit diagram showing a configuration of a black level depression detection circuit 30B according to the second circuit example. Also here, the black level depression detection circuit 30B is shown together with a unit pixel 11 in a certain pixel column.

Referring to FIG. 7, the black level depression detection circuit 30B according to the second circuit example utilizes the DAC 18 and the comparator 21 and AND circuit 22 of the column processing section 14 similarly as in the first circuit example and additionally includes an inverter 34, a latch circuit 35 and a reset level correction circuit 36. The black level depression detection circuit 30B is configured such that it performs black level depression detection within a detection period which is a fixed period from a timing at which the reset pulse RS which is rendered active upon a resetting action of the unit pixel 11 is rendered inactive.

Within a black level depression detection period, the DAC 18 outputs a black level depression detection value of a fixed value which is lower by a fixed width or detection width ΔV than a maximum value of the reference voltage VREF. The black level depression detection value is set similarly as in the first circuit example and is used as an index which indicates a degree by which the reset level for the analog signal VSL drops from that in a normal state as a result of an influence of excessively high light before it is decided that a black sun phenomenon occurs.

The DAC 18 produces, when suitable digital data is inputted thereto, a black level depression detection value for black level depression detection as the reference voltage VREF in addition to a stepwise ramp waveform for reset level decision and another ramp waveform for signal level decision. In other words, the detection width ΔV for the determination of the black level depression detection value can be changed arbitrarily with the digital data to be inputted to the DAC 18.

The comparator 21 performs a decision of the reset level Vres and the signal level Vsig based on the reference voltage VREF of a ramp waveform. In addition, when the signal voltage VSL becomes lower than the black level depression detection value within a black level depression detection period, the comparator 21 detects occurrence of a black sun phenomenon caused by excessively high light. The comparison output CMP_OUT of the comparator 21 is provided directly to the other input of the AND circuit 22 (configuration of FIG. 1). The comparison output CMP_OUT is further provided to the D (data) terminal of the latch circuit 35 after it is reversed in polarity by the inverter 34.

The latch circuit 35 is initialized at a latch output LATCH_OUT thereof by a preset signal LATCH_PRST which is rendered active ("L" level) in synchronism with the reset pulse RS. When the latch signal SUN_LATCH has the "H" level, the latch circuit 35 stores the comparison output CMP_OUT of the comparator 21, that is, a black level depression detection result. The latch circuit 35 retains the stored black level depression detection result stored when the latch signal SUN_LATCH has the "L" level. The latch circuit having the circuit configuration described hereinabove with reference to FIG. 6 can be used as the latch circuit 35.

Here, since it is necessary to keep the black level depression detection result for a fixed period of time, in particular, within a reset period within which the reset level is outputted, when the reset period comes to an end, initialization of the latch circuit 35 is performed. In particular, initialization of the latch output LATCH_OUT of the latch circuit 35 is performed with the preset signal LATCH_PRST which is rendered active ("L" level) at a timing of the end of the reset period. The latch output LATCH_OUT of the latch circuit 35 is supplied to the reset level correction circuit 36.

The reset level correction circuit 36 serves as a prevention section, and is placed into an active state in response to the latch output LATCH_OUT and outputs a correction level for the correction of the reset level Vres. The correction level is set as a level within the variation width of the reference voltage VREF having a ramp waveform such as, for example, a power supply level. A switch element 37 is connected between an output terminal of the reset level correction circuit 36 and a column signal line 122 (122-1 to 122-m). The switch element 37 is placed into a closed state in response to a correction permission signal HOSEI_EN which is rendered active ("H" level) after the black level depression period comes to an end and supplies a correction level outputted from the reset level correction circuit 36 to the column signal line 122.

Figure 8:
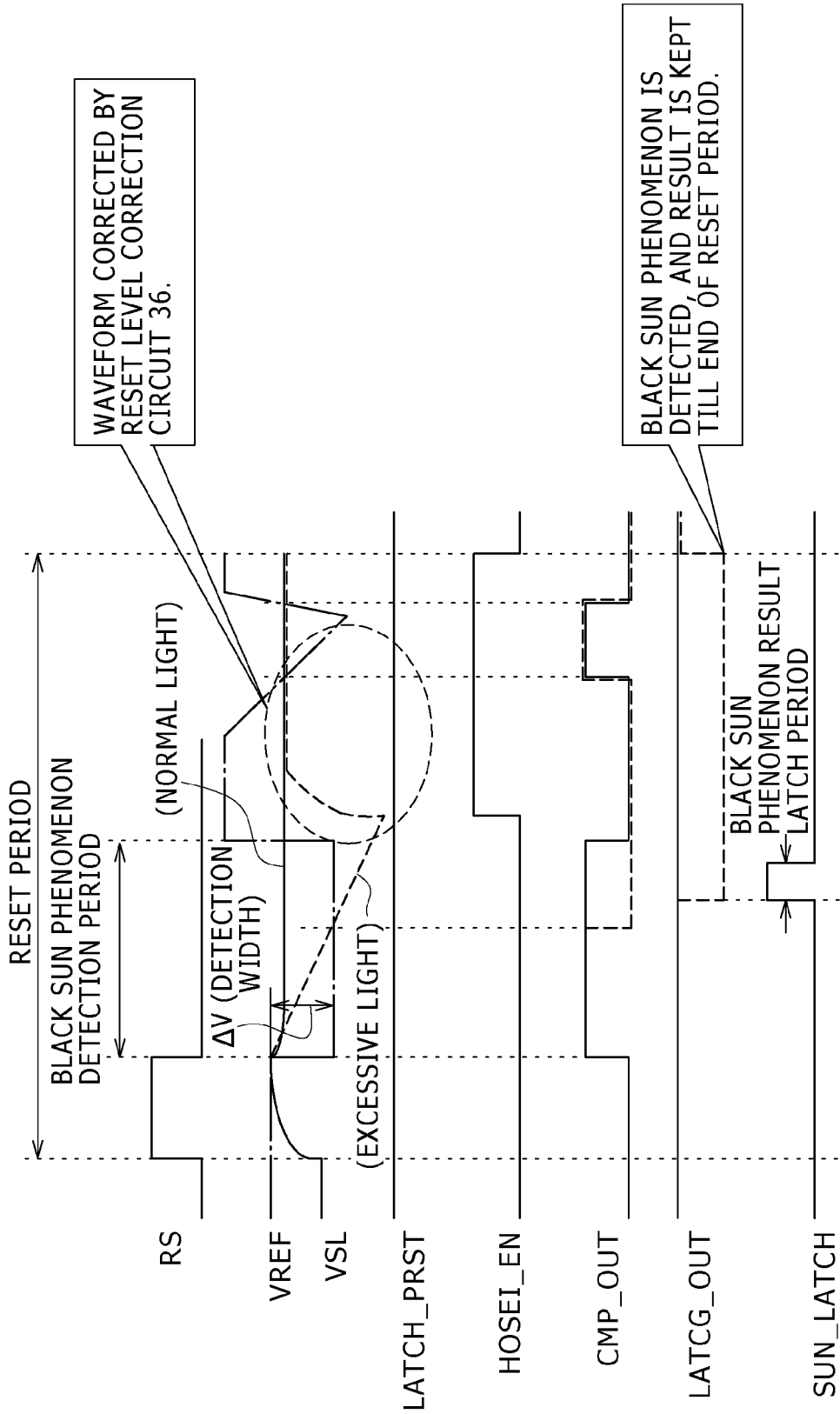
FIG. 8 is a timing chart illustrating circuit action of the black level depression detection circuit of FIG. 7.

Now, circuit operation of the black level depression detection circuit 30B having the configuration described above is described with reference to a timing chart of FIG. 8. FIG. 8 illustrates a timing relationship among the reset pulse RS, reference voltage VREF, signal voltage VSL, preset signal LATCH_PRST, correction permission signal HOSEI_EN, comparison output CMP_OUT, latch output LATCH_OUT and latch signal SUN_LATCH.

(1) Where a black sun phenomenon caused by excessively high light is detected

If the reference level Vres for the signal voltage VSL drops to the black level depression detection value as a result of incidence of excessively high light, that is, if the dropping amount reaches the detection width ΔV, then the comparison output CMP_OUT of the comparator 21 reverses from the "L" level to the "H" level. The comparison output CMP_OUT of the "H" level is inverted to the "L" level by the inverter 34 and is stored into the latch circuit 32 when the latch signal SUN_LATCH changes over to the "H" level.

Then, when the latch signal SUN_LATCH changes over from the "H" level to the "L" level, the latch output LATCH_OUT of the latch circuit 32 is retained at the "L" level. The "L" level state of the latch output LATCH_OUT is kept until the reset period comes to an end at which the preset signal LATCH_PRST is rendered active ("L" level). The latch output LATCH_OUT is fed back to the reset level correction circuit 36.

The reset level correction circuit 36 is placed into an active state in response to the latch output LATCH_OUT of the "L" level and outputs a correction level, for example, of the power supply level. It is to be noted, however, that, during the black level depression detection period, since the correction permission signal HOSEI_EN remains at the "L" level, that is, since the connection between the reset level correction circuit 36 and the column signal line 122 (122-1 to 122-m) remains in an open state, correction of the reset level Vres by the reset level correction circuit 36 is not performed.

When the black level depression detection period comes to an end, the correction permission signal HOSEI_EN changes over to the "H" level, and the switch element 37 is placed into an on state in response to the correction permission signal HOSEI_EN. Consequently, the connection between the reset level correction circuit 36 and the column signal line 122 is placed into a closed state. Therefore, the correction level outputted from the reset level correction circuit 36 is supplied to the column signal line 122 through the switch element 37.

At this time, the column signal line 122 is in a state wherein the reset level Vres for the signal voltage VSL which is dropped by the incidence of excessively high light is provided thereto. Since the correction level is supplied from the reset level correction circuit 36 to the column signal line 122 while the column signal line 122 is in the state described, correction of the reset level Vres is performed.

In particular, the reset level Vres is compulsorily raised to the correction level, more particularly to the power supply level and exceeds the black level depression detection value. Consequently, the comparison output CMP_OUT of the comparator 21 is reversed from the "H" level to the "L" level, and as a result, the black level depression detection is canceled. Accordingly, even if excessively high light, particularly very intense light like the sunlight, enters the unit pixel 11, an otherwise possible black sun phenomenon can be prevented.

After the correction of the reset level Vres, the actions of the normal differencing process, that is, the actions within the reset period and the signal readout period described hereinabove, are successively performed. Consequently, a digital signal of the signal level which corresponds to the intensity of incident light to the unit pixel 11 is outputted to the outside.

(2) In a normal case wherein no black level depression occurs

If normal light which is within the permissible range enters the unit pixel 11, then since the reset level Vres for the signal voltage VSL does not drop, the comparison output CMP_OUT of the comparator 21 is not reversed but remains at the "L" level. At this time, since the latch output LATCH_OUT keeps the "H" level, the reset level correction circuit 36 remains in an inactive state, and correction of the reset level Vres by the reset level correction circuit 36 is not performed. After the black level depression detection period comes to an end, a normal differencing process is performed.

Since each of the black level depression detection circuits 30A and 30B according to the first and second circuit examples described hereinabove has a very simple circuit configuration wherein it makes use of an existing DAC 18, comparator 21 and AND circuit 22 used in a column-parallel ADC array and additionally includes a simple digital circuit such as a latch circuit 32 or 35 (refer to FIG. 6) which is formed, for example, from a single NAND circuit 41, a single inverter 42 and a pair of switch elements 43 and 44, the layout area of a circuit for preventing a black sun phenomenon can be suppressed to the minimum.

Since a circuit for preventing a black sun phenomenon can be implemented with a circuit configuration of a small scale in this manner, even if there is some restriction to the layout area when a circuit for preventing a black sun phenomenon is disposed for each column as in the case of a solid-state image pickup device incorporating column-parallel ADCs wherein an ADC 20 (20-1 to 20-m) is disposed for each column, the circuit for preventing a black sun phenomenon can be disposed within the restriction. As a result, a solid-state image pickup device incorporating column-parallel ADCs which can prevent a black sun phenomenon, which occurs when very intense light like the sunlight enters, with certainty can be implemented.

It is to be noted that, in the embodiment described above, detection of occurrence of a black sun phenomenon by the black level depression detection circuit 30A or 30B is performed at the beginning of a reset period within which the reset level Vres for the unit pixel 11 is to be read out. However, it is possible also to perform the detection otherwise between a reset period and a signal readout period.

Further, in the embodiment described above, the DAC 18 is used as a member or production circuit for producing the reference voltage VREF of a ramp waveform. However, the production circuit is not limited to the DAC 18, but any circuit may be used if it can produce the reference voltage VREF of a ramp waveform.

[Applications]

The solid-state image pickup apparatus 10 incorporating column-parallel ADCs according to the embodiment described above can be suitably used as an image pickup device or image inputting device in an image pickup apparatus such as a video camera or a digital still camera.

Here, the image pickup apparatus may be a solid-state image pickup device as an image pickup device, a camera module which includes an optical system for forming an image of image light of an image pickup subject on an image pickup plane or light receiving plane of such a solid-state image pickup device as mentioned above and a signal processing circuit of the solid-state image pickup device and is incorporated in and used together with an electronic apparatus such as a portable telephone set, or a camera system of a digital still camera, a video camera or the like in which such a camera module as mentioned above is incorporated.

Figure 9:
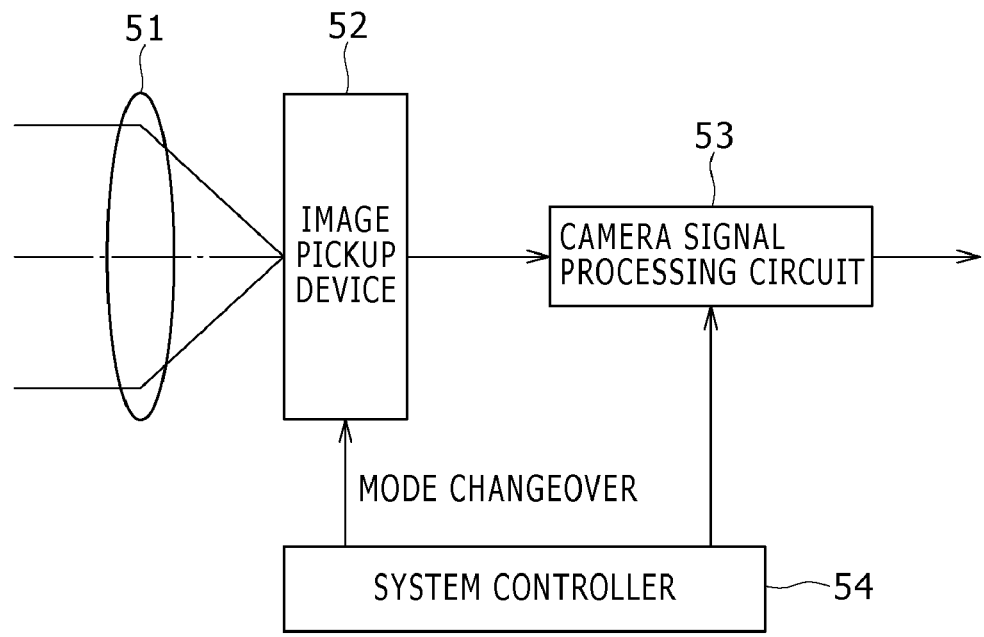
FIG. 9 is a block diagram showing an example of a configuration of an image pickup apparatus to which the present embodiment is applied.

FIG. 9 is a block diagram showing an example of an image pickup apparatus to which the present invention is applied. Referring to FIG. 9, the image pickup apparatus shown includes an optical system including a lens 51, an image pickup device 52, a camera signal processing circuit 53 and a system controller 54.

The lens 51 forms an image of image light from an image pickup subject on an image pickup plane of the image pickup device 52. The image pickup device 52 converts the image light of the image formed on the image pickup plane by the lens 51 in a unit of a pixel into an electric signal to obtain an image signal to be outputted. The solid-state image pickup apparatus 10 incorporating column-parallel ADCs according to the embodiment described hereinabove is used as the image pickup device 52.

The camera signal processing circuit 53 performs various signal processes for the image signal outputted from the image pickup device 52. The system controller 54 controls the image pickup device 52 and the camera signal processing circuit 53. Particularly if the column-parallel ADCs of the image pickup device 52 can perform AD conversion actions corresponding to different action modes including a normal frame rate mode of a progressive scanning method wherein information of all pixels is read out and a high speed frame rate mode wherein the exposure time for each pixel is set to 1/N that in the normal frame rate mode to raise the frame rate to N times, then the system controller 54 performs changeover control of the action mode in response to an instruction from the outside.

Where the solid-state image pickup apparatus 10 incorporating column-parallel ADCs according to the embodiment described hereinabove is used as the image pickup device or image inputting apparatus 52 in a camera module which is incorporated in and used together with an electronic apparatus such as a portable telephone set or a camera system of a digital still camera, a video camera or the like in which such a camera module as mentioned above is incorporated, the layout area of a circuit for preventing a black sun phenomenon in the solid-state image pickup apparatus 10 can be suppressed to the minimum. Therefore, the solid-state image pickup apparatus 10 can contribute significantly to reduction of the circuit scale of the entire system.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device, comprising:
   a pixel array section including a plurality of unit pixels, each unit pixel including a photoelectric conversion element which converts incident light from the outside into an electric signal;
   a reference signal production section configured to generate a reference signal of a ramp waveform and output a predetermined detection value within a period when a black sun phenomenon is to be detected;
   a comparison section configured to compare a reset level and a signal level included in an analog signal output from said plurality of unit pixels with the reference voltage or the detection value;
   a counter configured to start a counting action synchronized with supply of the reference signal to said comparison section and continue the counting action until a comparison output of said comparison section indicates a reversal to measure a comparison time period until the comparison by said comparison section comes to an end to obtain count values corresponding to the reset level and the signal level;
   a detection section configured to retain a comparison result from the comparison section when the reset level is equal to the detection value as a result of the detection of a black sun phenomenon for a fixed period of time; and
   a prevention section configured to prevent a black sun phenomenon based on a result of the detection of said detection section by causing said counter to perform the counting action until a full count value corresponding to a white signal level is reached when said detection section detects a black sun phenomenon.

2. The solid-state image pickup device according to claim 1, further comprising:
   a memory to retain the count values from the counter as a digital signal.

3. The solid-state image pickup device according to claim 1, wherein the reversal occurs when the comparison result is equal to or higher than the detection value.

4. The solid-state image pickup device according to claim 1, wherein the comparison time period is from when the reference signal is provided from the comparison section until when the comparison result is reversed in polarity.

5. The solid-state image pickup device according to claim 1, wherein the comparison time period is from when the reference signal is provided from the comparison section until when the comparison result is equal to or higher than the detection value.

6. The solid-state image pickup device according to claim 1, further comprising:
   an inverter to reverse a polarity of the comparison result when the comparison result is equal to or higher than the detection value.

7. A driving method for a solid-state image pickup device which includes a pixel array section including a plurality of unit pixels, each unit pixel including a photoelectric conversion element which converts incident light from the outside into an electric signal, a reference signal production section configured to generate a reference signal of a ramp waveform, a comparison section configured to compare a reset level and a signal level included in an analog signal output from said plurality of unit pixels with the reference voltage, and a counter configured to start a counting action synchronized with supply of the reference signal to said comparison section and continue the counting action until a comparison output of said comparison section indicates a reversal to measure a comparison time period until the comparison by said comparison section comes to an end to obtain a count value corresponding to the reset level and the signal level, said driving method comprising:
   a first step of outputting a predetermined detection value from said reference signal production section to detect a black sun phenomenon;
   a second step of retaining a comparison result from the comparison section when the reset level is equal to the detection value as a result of the detection of a black sun phenomenon for a fixed period of time; and
   a third step of preventing a black sun phenomenon based on a result of the detection at the second step by causing said counter to perform the counting action until a full count value corresponding to a white signal level is reached when said detection section detects a black sun phenomenon.

8. An image pickup apparatus, comprising:
   a solid-state image pickup device; and
   an optical system configured to form an image of image light from an image pickup subject on an image pickup plane of said solid-state image pickup device,
   said solid-state image pickup device including
      a pixel array section including a plurality of unit pixels disposed in the pixel array section, each unit pixel including a photoelectric conversion element which converts incident light from the outside into an electric signal;

a reference signal production section configured to generate a reference signal of a ramp waveform and output a predetermined detection value within a period when a black sun phenomenon is to be detected;

a comparison section configured to compare a reset level and a signal level included in an analog signal output from said plurality of unit pixels with the reference voltage or the detection value;

a counter configured to start a counting action synchronized with supply of the reference signal to said comparison section and continue the counting action until a comparison output from said comparison section indicates a reversal to measure a comparison time period until the comparison by said comparison section comes to an end to obtain count values corresponding to the reset level and the signal level;

a detection section configured to retain a comparison result from the comparison section when the reset level is equal to the detection value as a result of the detection of a black sun phenomenon for a fixed period of time; and a prevention section configured to prevent a black sun phenomenon based on a result of the detection of said detection section by causing said counter to perform the counting action until a full count value corresponding to a white signal level is reached when said detection section detects a black sun phenomenon.

* * * * *